(12) United States Patent
Kang et al.

(10) Patent No.: US 7,534,680 B2
(45) Date of Patent: *May 19, 2009

(54) BIPOLAR TRANSISTOR, BICMOS DEVICE, AND METHOD FOR FABRICATING THEREOF

(75) Inventors: Jin Yeong Kang, Daejeon-Shi (KR); Seung Yun Lee, Daejeon-Shi (KR); Kyoung Ik Cho, Daejeon-Shi (KR)

(73) Assignee: Electronics and Telecommunications Research Institute, Daejon-Shi (KR)

( * ) Notice: Subject to any disclaimer, the term of this patent is extended or adjusted under 35 U.S.C. 154(b) by 0 days.

This patent is subject to a terminal disclaimer.

(21) Appl. No.: 11/797,071

(22) Filed: Apr. 30, 2007

(65) Prior Publication Data

US 2007/0287234 A1    Dec. 13, 2007

Related U.S. Application Data (62) Division of application No. 10/872,593, filed on Jun. 22, 2004, now abandoned.

(30) Foreign Application Priority Data

Nov. 19, 2003   (KR) ............................. 2003-82032

(51) Int. Cl.
H01L 21/8238 (2006.01)
(52) U.S. Cl. .................... 438/202; 438/207; 438/222; 438/241; 257/E21.695
(58) Field of Classification Search ......... 438/309–376, 438/202–234; 257/E21.695, E1.696
See application file for complete search history.

(56) References Cited

U.S. PATENT DOCUMENTS

| 4,786,610 | A | * | 11/1988 | Blossfeld | ..................... 438/362 |
| 5,523,606 | A | | 6/1996 | Yamazaki | |
| 5,583,059 | A | | 12/1996 | Burghartz | |
| 6,028,344 | A | | 2/2000 | Hashimoto | |

(Continued)

FOREIGN PATENT DOCUMENTS

| JP | 01183150 | 7/1989 |
| KR | 1020020018056 | 3/2002 |
| KR | 1020030037356 | 5/2003 |

(Continued)

OTHER PUBLICATIONS

Katsuyoshi et al; "A 0.2-um 180-GHz-fmax 6.7-ps-ECL SOI/HRS Self-Aligned SEG SiGe HBT/CMOS Technology for Microwave and High-Speed Digital Applications"; IEEE; Feb. 2002; pp. 271-278.

(Continued)

*Primary Examiner*—H. Jey Tsai
(74) *Attorney, Agent, or Firm*—Lowe Hauptman Ham & Berner, LLP (57) ABSTRACT

Provided are bipolar transistor, BiCMOS device and method of fabricating thereof, in which an existing sub-collector disposed beneath a collector of a SiGe HBT is removed and a collector plug disposed at a lateral side of the collector is approached to a base when fabricating a Si-based very high-speed device, whereby it is possible to fabricate the SiGe HBT and an SOI CMOS on a single substrate, reduce the size of the device and the number of masks to be used, and implement the device of high density, low power consumption, and wideband performance.

1 Claim, 7 Drawing Sheets

U.S. PATENT DOCUMENTS

| | | | |
|---|---|---|---|
| 6,548,364 | B2 | 4/2003 | Hsu |
| 6,806,554 | B2 | 10/2004 | Hsu |
| 6,933,201 | B2 | 8/2005 | Tominari et al. |
| 2002/0102815 | A1* | 8/2002 | Hashimoto et al. ........... 438/435 |
| 2003/0157774 | A1* | 8/2003 | Tominari et al. ............. 438/312 |
| 2005/0139921 | A1 | 6/2005 | Kang et al. |

FOREIGN PATENT DOCUMENTS

| | | |
|---|---|---|
| JP | 07-335663 | 3/1994 |
| JP | 09-168954 | 6/1994 |
| JP | 7153776 | 6/1995 |

OTHER PUBLICATIONS

Burghartz et al.; "A Low-Capacitance Bipolar/BiCMOS Isolation Technology, Part1-Concept, Fabrication Process, and Characterization"; IEEE; Aug. 1994; pp. 1379-1387.

Mastrapasque et al.; "Minimizing Thermal Resistance and Collector-to-Substrate Capacitance in SiGe BiCMOS on SOI"; IEEE; Mar. 2002; pp. 145-147.

Harame et al.; "Current Status and Future Trends of SiGe BiCMOS Technology"; IEEE; Nov. 2001; pp. 2575-2594.

Tang et al. "A Low-Cost Modular SiGe BiCMOS Technology and Analog Passives for High-Performance RF and Wide-Band Applications"; IEEE; 2000; pp. 102-105.

Suligoj et al.; A Novel Horizontal Current Bipolar Transistor (HCBT) for Vertrical BiCMOS Integration; pp. 89-90.

Berranger et al.; Integration of SiGe heterojunction bipolar transistors in a 200 mmm industrial BiCMOS technology; Thin Solid Films 294; 1997; pp. 250-253.

* cited by examiner

BIPOLAR TRANSISTOR, BICMOS DEVICE, AND METHOD FOR FABRICATING THEREOF

CROSS REFERENCE TO RELATED APPLICATION

This application is a divisional of U.S. Ser. No. 10/872,593, filed on Jun. 22, 2004 now abandoned. This application, in its entirety, is incorporated herein by reference.

BACKGROUND OF THE INVENTION

1. Field of the Invention

The present invention relates to a bipolar transistor and a method for fabricating the same and, specifically, a SiGe bipolar complementary metal oxide semiconductor (BiCMOS) device integrated on a silicon on insulator (SOI) and a method for fabricating the same.

2. Description of the Prior Art

In the past days, gallium arsenide (GaAs) compound semiconductors have been widely used in the fabrication of radio frequency (RF) devices for information communications, and CMOS devices have been widely used in the fabrication of analog/digital circuits. In the recent days, an RF/analog/digital integration chip (SoC: system on chip) has been widely used, and silicon germanium (SiGe) BiCMOS devices are most suitable for it's manufacturing purpose and thus widely used.

SiGe BiCMOS technology is that a SiGe heterojunction bipolar transistor (HBT) suitable for RF/analog circuits and a CMOS device suitable for digital circuits are both integrated on a single substrate, nowadays the SiGe BiCMOS technology has been employed for the integration chip fabrication of an information communication apparatus such as a portable mobile phone, and then the SiGe BiCMOS is a widespread technology.

The SiGe HBT is a technology that has been improved from a conventional bipolar transistor, and makes use of not silicon (Si) but a SiGe alloy material that Si is intermixed with Ge of about 20%, as a base. The SiGe HBT, as compared with a conventional bipolar transistor, has advantages that large current gain can be obtained, and its base can be formed thin by increasing the impurity concentration thereof by about 100 times, thus it is possible to operate at a high speed and a high frequency. However, a SiGe BiCMOS device fabricated in accordance with the conventional art, as compared with a CMOS device, has problems that the process is more complex and the production cost is higher because of requiring 10 or more sheets of mask additionally, and that the integration capability of the SiGe BiCMOS device is not as high as that of the CMOS device because devices of the HBT are not downsized. To overcome these problems, an integration chip composed of either only a CMOS device or only a silicon on insulator (SOI) CMOS device having low power consumption among CMOS devices, has been developed by a number of universities, etc. However, the integration chip has a problem that its performance is insufficient due to the restricted properties of the CMOS devices.

SUMMARY OF THE INVENTION

Accordingly, the present invention is contrived to solve the above-mentioned problems, and the present invention is directed to a SiGe BiCMOS device that the number of masks to be used is reduced and a method for fabricating the same.

Further, the present invention is directed to a SiGe BiCMOS device that a size of a SiGe HBT device is reduced and a method for fabricating the same.

Still further, the present invention is directed to a SiGe BiCMOS device capable of realizing high density, low power consumption, and wideband performances.

One aspect of the present invention is to provide a bipolar transistor, comprising: a first insulating film; a collector formed on the first insulating film, the collector being made of any one of N-type and P-type semiconductors; a collector plug formed on the first insulating film, the collector plug being contacted with the collector, made of the same type of semiconductor as the collector, and more highly doped than the collector; a second insulating film disposed on a portion where the collector and the collector plug are contacted to each other; a base formed on the collector, the base being contacted with the second insulating film and made of a different type of semiconductor from the collector; and an emitter formed on the base, the emitter being made of the same type of semiconductor as the collector.

A second aspect of the present invention is to provide a BiCMOS device, comprising: a first insulating film; a bipolar transistor, including: a collector formed on the first insulating film, the collector being made of any one of N-type and P-type semiconductors; a collector plug formed on the first insulating film, the collector plug being contacted with the collector, made of the same type of semiconductor as the collector, and more highly doped than the collector; a second insulating film disposed on a portion where the collector and the collector plug are contacted to each other; a base formed on the collector, the base being made of a different type of semiconductor from the collector; and an emitter formed on the base, the emitter being made of the same type of semiconductor as the collector; an NMOS device, including: a P-well disposed on the first insulating film and made of the P-type semiconductor; a first source and a first drain respectively disposed on a left side and a right side of a top the P-well and made of the N-type semiconductor; a first gate insulating film disposed on the P-well; and a first gate disposed on the first gate insulating film; and a PMOS device, including: an N-well disposed on the first insulating film and made of the N-type semiconductor; a second source and a second drain respectively disposed on a left side and a right side of a top the N-well and made of the P-type semiconductor; a second gate insulating film disposed on the N-well; and a second gate disposed on the second gate insulating film.

A third aspect of the present invention is to provide a method for manufacturing a bipolar transistor, comprising the steps of: forming a collector plug, in an SOI substrate having a first insulating film and a first semiconductor that is made of any one of N-type and P-type semiconductors and disposed on the first insulating film, the collector plug being made of the same type as the first semiconductor and more highly doped than the first semiconductor on a portion of the first semiconductor; forming a buffer oxide film and a nitride film; forming any one of a single open slit and a plurality of open slits by patterning the nitride film, and removing the nitride film disposed on a portion where a field oxide film is to be formed; forming a field oxide film, a collector made of the first semiconductor surrounded with the field oxide film and the collector plug, and an oxide film disposed on a portion where the collector and the collector plug are contacted to each other and having a thickness thinner than that of the field oxide film, by performing a thermal oxidation process; removing the nitride film; forming a base on the collector, the base being made of a different type of semiconductor from the first semiconductor; forming a second insulating film; and forming an emitter connected to the base through a contact hole of the second insulating film, the emitter being made of the same type of semiconductor as the first semiconductor.

A fourth aspect of the present invention is to provide a method for manufacturing a BiCMOS device, comprising the steps of: forming a collector plug, a P-well doped with P-type impurities, and an N-well doped with N-type impurities, in an SOI substrate having a first insulating film and a first semiconductor that is made of any one of N-type and P-type semiconductors and disposed on the first insulating film, the collector plug being made of the same type as the first semiconductor and more highly doped than the first semiconductor on a portion of the first semiconductor; forming a buffer oxide film and a nitride film; forming any one of a single open slit and a plurality of open slits by patterning the nitride film, and removing the nitride film disposed on a portion where a field oxide film is to be formed; forming a field oxide film, a collector made of the first semiconductor surrounded with the field oxide film and the collector plug, and an oxide film disposed on a portion where the collector and the collector plug are contacted to each other and having a thickness thinner than that of the field oxide film, by performing a thermal oxidation process; removing the nitride film; forming a gate oxide film; depositing a base epitaxial layer made of a different type of semiconductor from the first semiconductor; forming a second insulating film; forming an emitter and a gate of a CMOS device by etching the gate oxide film and the second insulating film, after depositing and patterning a semiconductor of the same type as the first semiconductor; forming a base by patterning the base epitaxial layer; performing N-type doping with a low concentration into a source/drain region of the P-well, and P-type doping with a low concentration into a source/drain region of the N-well; forming a spacer in a sidewall of the emitter and a sidewall of the gate of the CMOS device; and performing N-type doping with a high concentration into a source/drain region of the NMOS device, and P-type doping with a high concentration into a source/drain region of the PMOS device.

BRIEF DESCRIPTION OF THE DRAWINGS

The above and other objectives, features and advantages of the present invention will be more apparent from the following detailed description taken in conjunction with the accompanying drawings, in which.

DETAILED DESCRIPTION OF THE PREFERRED EMBODIMENTS

Hereinafter, the present invention will be described with reference to the accompanying drawings. As many apparently widely different embodiments of the present invention may be made without departing from the spirit and scope thereof, it is to be understood that the invention is not limited to the below specific embodiments thereof. Embodiments of the present invention are to provide to more fully explain the present invention to those skilled in the art.

Figure 1:
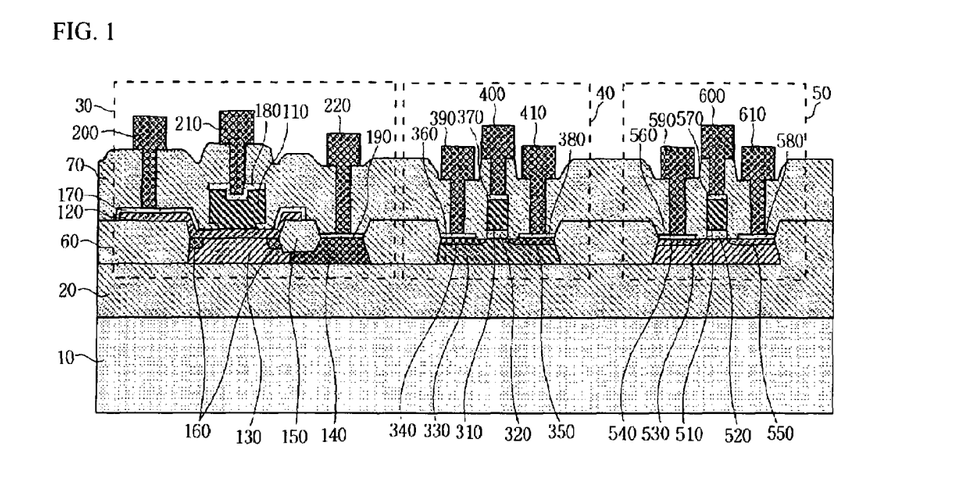
FIG. 1 is a schematic cross-sectional view of a SiGe BiCMOS device according to a preferred embodiment of the present invention.

FIG. 1 is a schematic cross-sectional view of a SiGe BiCMOS device according to a preferred embodiment of the present invention.

In FIG. 1, the SiGe BiCMOS device comprises a substrate 10, an insulating film 20, a SiGe HBT 30, an NMOS device 40, a PMOS device 50, and a field insulating film 60.

The substrate 10 is, for example, composed of a p-type material with resistivity of about 6 to 100 ohm centimeter ($\Omega \cdot cm$). A high resistance substrate is a substrate doped with a low concentration, and thus, substrate performances become higher due to the lower substrate capacitance, but there is a disadvantage that the substrate cost is expensive.

The insulating film 20 is, for example, an oxide film with a thickness of 0.3 to 2 µm, and preferably, a thick insulating film. However, there is a disadvantage that the SOI having the thick insulating film is expensive.

The SiGe HBT 30 comprises a collector 130, a collector plug 140, a collector insulating film 150, a base 120, and an emitter 110. The collector 130 and the collector plug 140 are disposed on the insulating film 20 and contacted to each other. The collector insulating film 150 is disposed on a portion where the collector 130 and the collector plug 140 are contacted to each other. The base 120 is disposed on the collector, and the emitter 110 is disposed on the base.

The collector 130 and the collector plug 140 are, for example, $N^{31}$ and $N^+$ doped silicon with a thickness of 250 to 700 nm, respectively. The collector insulating film 150 has a thickness less than that of the field insulating film 60. The base 120 is, for example, P-type silicon with a thickness of 120 nm. The base 120 can be comprised of multiple layers including a buffer layer made of silicon with a thickness of 40 nm, a SiGe layer that the Si is intermixed with Ge of 20%, with a thickness of 40 nm, and a cap layer made of silicon with a thickness of 40 nm. The emitter 110 is, for example, N-type polysilicon with a thickness of 350 nm.

There are several advantages to the SiGe HBT configured by the above-described manner, as compared with the prior art. In the SiGe HBT according to the conventional art, the connection between the collector and the collector plug was implemented with a sub-collector disposed below the collector. However, according to the present invention, it is possible to considerably decrease the power loss by removing the sub-collector and directly connecting the collector and the collector plug, and also by eliminating leak currents of capacitor components, which flow from the sub-collector to the substrate. In addition, the leveling dimension and integration capability of the device can be increased by reducing the dimension of the collector insulating film 150, and a resistance value between the base 120 and a base metal wiring 200 can be minimized by shortening the distance between the devices, and thus noise removal can be improved. Further, it is possible to improve the current driving forces, if a high concentration arsenic (As) layer having a thickness of 100 nm around the bottom interface of the collector 130 is formed, or a high concentration shallow $N^+$ layer which is doped with phosphorus into the collector 130 and thermal-treated to pile-up the phosphorus (P) around the bottom interface is formed.

The SiGe HBT 30 can further comprise a base protective layer 160 disposed at an edge of a portion where the base 120 and the collector 130 are contacted to each other. The base protective layer 160, when formed of $P^+$-type silicon, serves to increase the current gain by preventing the recombination-extinction of an electron that is injected from the emitter into the base. The collector plug 140 should appropriately keep a distance with the base protective layer 160. The reasons are that the current driving force may be limited in case where the distance between the collector plug and the base protective layer is too much apart from, and the breakdown withstanding voltage may be lowered in case where the distance is too much close.

The SiGe HBT 30 can further comprise metal wirings 200, 210 and 220 for external connection of the emitter 110, the base 120, and the collector plug 140. Also, the SiGe HBT 30 can further comprise silicide layers 170, 180 and 190 to improve the contact properties of the metal wirings 200, 210 and 220, with the emitter 110, the base 120 and the collector plug 140, respectively. The metal wirings 200, 210 and 220 are disposed in the corresponding contact holes of the insulating film 70, respectively.

The NMOS device 40 comprises a P-well 330, source/drain 340 and 350, a gate 310, and a gate insulating film 320. The P-well 330 is disposed on the oxide film 20, and it has an example configuration of P-type silicon with a thickness in the range of 250 nm to 700 nm. The source/drain 340 and 350 may be N-type silicon, for example. The gate 310 is, for example, N-type polysilicon with a thickness of 350 nm. The gate insulating film 320 is, for example, an oxide layer with a thickness in the range of 15 nm to 2 nm. The NMOS device 40 can further comprise metal wirings 390, 410 and 400 for external connection between the source/drain 340 and 350, and the gate 310. Also, the NMOS device 40 can further comprise silicide layers 360, 380 and 370 to improve the contact properties of the metal wirings 390, 410 and 400, with the source/drain 340 and 350, and the gate 310, respectively. The metal wirings 390, 410 and 400 are disposed in the corresponding contact holes of the insulating film 70, respectively.

The PMOS device 50 comprises an N-well 530, source/drain 540 and 550, a gate 510, and a gate insulating film 520. The N-well 530 is disposed on the oxide film 20, and it has an example configuration of N-type silicon with a thickness of 250 nm to 700 nm. The source/drain 540 and 550 are, for example, P-type silicon. The gate 510 is, for example, N-type polysilicon with a thickness of 350 nm. The gate insulating film 520 is, for example, an oxide film with a thickness of 15 nm to 2 nm. The PMOS device 50 can further comprise metal wirings 590, 610 and 600 for external connection between the source/drain 540 and 550, and the gate 510. Also the PMOS device 50 can further comprise silicide layers 560, 580 and 570 to improve the contact properties of the metal wirings 590, 610 and 600, with the source/drain 540 and 550, and the gate 510, respectively. The metal wirings 590, 610 and 600 are disposed in the corresponding contact holes of the insulating film 70, respectively.

The configuration as described above has advantages that an HBT having excellent RF and analog performances can be mounted on a substrate such as an SOI CMOS device which has been widely employed for low power consumption, downsizing and high density of the device are possible by leveling the HBT device configuration along with the CMOS device, and the number of masks can be reduced by two sheet (for device isolation and sub-collector), as compared with the prior art.

FIGS. 2 to 18 illustrate cross-sectional views showing a sequence of fabrication processes for a SiGe BiCMOS device according to a preferred embodiment of the present invention.

Figure 2:
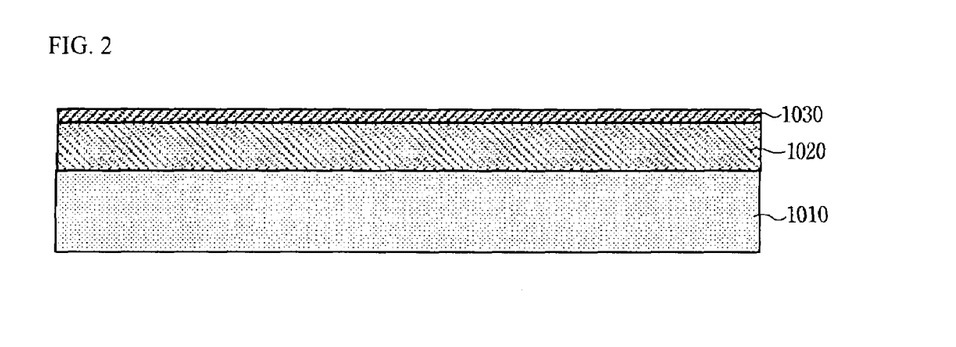
FIGS. 2 to 18 illustrate cross-sectional views showing a sequence of fabrication processes for a SiGe BiCMOS device according to a preferred embodiment of the present invention.
Figure 6:
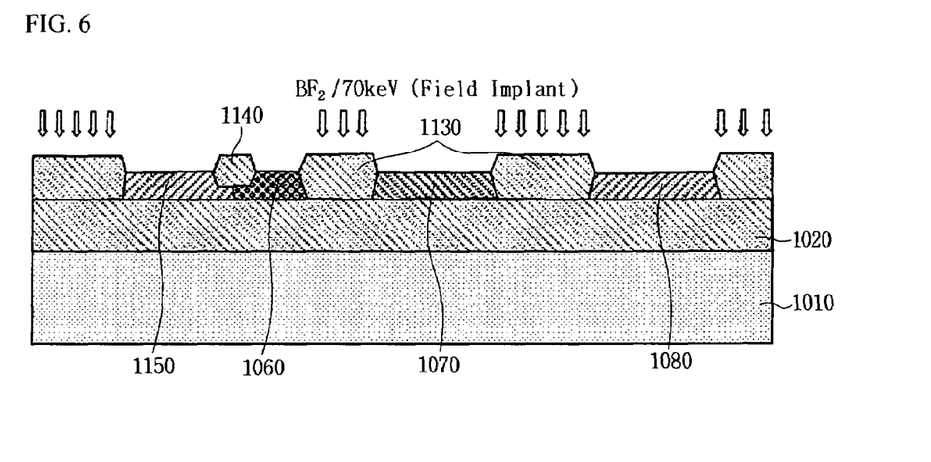

Referring to FIG. 2, an SOI substrate is prepared. In the SOI substrate, a silicon 1010 on the bottom may have, for example, P-type silicon with resistivity in the range of 6 to 100 ohm centimeter ($\Omega \cdot$cm). As an insulting film 1020, an oxide film with a thickness of about 0.3 to 2 µm is preferable. Preferably, the insulting film 1020 may be a thick film, but a thick insulating film would be expensive. Preferably, a silicon 1030 disposed on the insulating film may have a thickness of 50 to 100 nm. If the silicon 1030 has a thickness in the range of 250 nm to 700 nm, the process shown in FIG. 3 can be omitted. In this step, the silicon 1030 may be doped with arsenic (As) having ineffective thermal diffusion by $10^{18}$/cm$^3$, thereby an N$^+$ layer can be formed. When the N$^+$ layer is formed, the limiting value of the current driving force is improved. Subsequently, a collector may be doped with phosphorus (P) and the doped phosphorus (P) is piled up at an interface of the lower oxide film when a field oxide film of FIG. 6 is grown, thereby the N$^+$ layer also can be formed.

Figure 3:
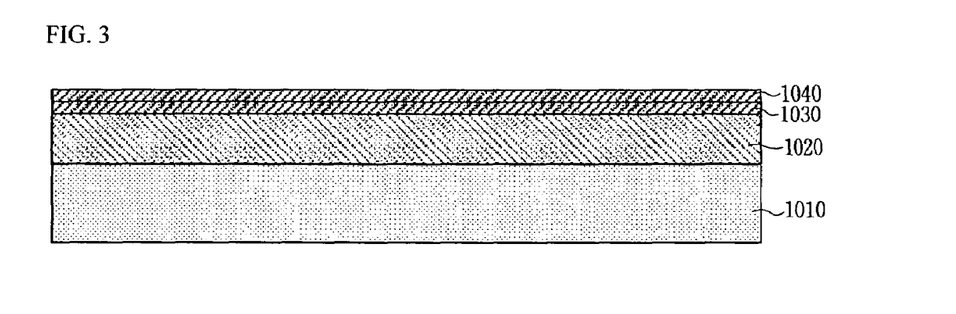

Referring to FIG. 3, a collector epitaxial layer 1040 is grown on the SOI substrate. This epitaxial growth can be performed by a reduced pressure chemical vapor deposition method at a pressure of several torr and a temperature of 1,100 □. At this time, the gases to be used are SiH$_2$Cl$_2$, GeH$_4$, PH$_3$, and H$_2$. The collector epitaxial layer 1040 has a thickness of 200 nm to 600 nm. If the layer is thin, it is suitable for high frequency circuits since the operation speed is fast, and if this layer is thick, it is suitable for power circuits since the breakdown withstanding voltage is high although the operation speed becomes slow. The epitaxial layer has a concentration of the phosphorus (P) in the range of $5 \times 10^{16}$ to $2 \times 10^{17}$ to achieve the optimization of the operation speed and the breakdown withstanding voltage, and as the thinner the thickness of the layer is, the higher concentration in phosphorus (P) of the epitaxial layer should be required. On the other hand, the low concentration in phosphorus (P) of the epitaxial layer should be required if the layer becomes thicker.

Figure 4:
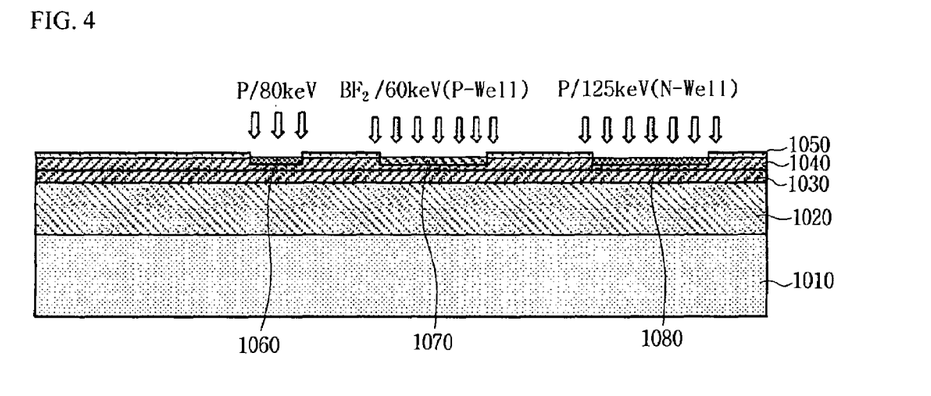

Referring to FIG. 4, a protective oxide film 1050 is formed on the collector epitaxial layer 1040, and then an ion implantation process is performed into a collector plug 1060 of the SiGe HBT with a high concentration, performed into a P-well 1070 of the NMOS device and an N-well 1080 of the PMOS device, and then, the protective oxide film 1050 is removed. The protective film is performed by using a low temperature oxide deposition (LTO) method at a temperature of 400□ with a thickness of 120 nm. The conditions of the ion implantation process are P, 80 KeV, and $4 \times 10^{15}$/cm$^2$ for the collector plug 1060, BF$_2$, 60 KeV, and $7.0 \times 10^{12}$/cm$^2$ for the P-well 1070 of the CMOS device, and P, 125 KeV, and $1.1 \times 10^{13}$/cm$^2$ for the N-well 1080.

Figure 5:
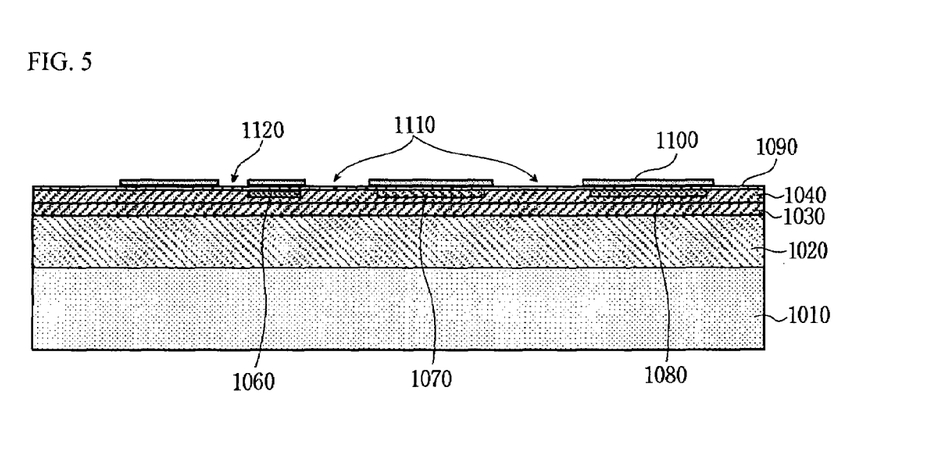

Referring to FIG. 5, a buffer oxide film 1090 and a nitride film (Si$_3$N$_4$) 1100 is formed, and then the nitride film 1100 is patterned to divide into an active region and an inactive region that is a field region. The nitride film 1100 is about 160 nm in thickness and grown by using a low pressure chemical vapor deposition (LPCVD) method. The nitride film 1100 serves to prevent oxidation of the active region. In the subsequent processes, the nitride film in a region 1110 of the field oxide film to be grown is removed for a wide region. However, in the subsequent processes, the nitride film in a region 1120 of the oxide film to be disposed between the collector and collector plug of the SiGe HBT is removed for a narrow region. This is to suppress the growth of the oxide film by reducing the contact area that the oxygen to be supplied contacts to the region 1120, and by decreasing the amount of oxygen to be supplied. Also, this region 1120 can be composed of a single open slit or a plurality of open slits. When the region 1120 is composed of the plurality of open slits, it means that the nitride film of the open slit is removed and the nitride film interposed between the open slits is not removed. The thickness of the oxide film to be formed in the subsequent process is controlled by the width and space of the open slit, and the width and space may be, for example, 0.2 to 0.5 µm.

Referring to FIG. 6, after a thick field oxide film 1130 and an oxide film 1140 disposed on the junction between the collector 1150 and the collector plug 1060 of the SiGe HBT are grown, and then the nitride film is removed. In order to realize extremely high device isolation before the growth of the oxide film, the ion implantation process is performed into a region in which the field oxide film 1130 is formed, under conditions of $BF_2$, 70 KeV, and $5\times10^{13}/cm^2$. The growth of the oxide films 1130 and 1140 is performed in a thermal oxidation furnace of 1000 □ for about 4 hours by a thermal oxidation process, and the thickness of the oxide film is 650 nm. After the oxide film is grown, the nitride film is etched using a heated phosphoric acid as an etchant.

Figure 7:
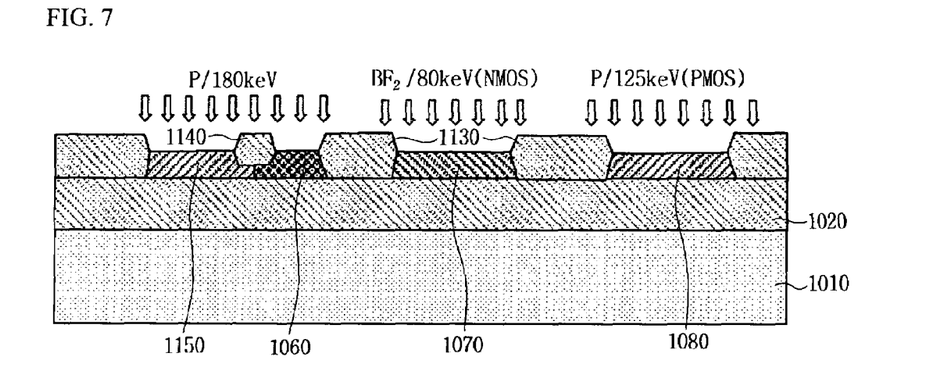

Referring to FIG. 7, the ion implantation process is performed into the collector 1150 and the collector plug 1060 of the SiGe HBT, or performed into the P-well 1070 and the N-well 1080 to finely adjust threshold voltages of the NMOS device and the PMOS device. The breakdown withstanding voltage is reduced to 3 V or less but an operation speed is more improved, by performing the ion implantation process into the collector 1150 and the collector plug 1060 of the SiGe HBT. Therefore, the aforementioned ion implantation process is performed only for the SiGe HBT to be used for very high speed digital or high speed analog. The conditions of the ion implantation are P, 180 KeV, and $2\times10^{13}/cm^2$ for the HBT collector 1150 and the collector plug 1060, $BF_2$, 80 KeV, and $7.7\times10^{12}/cm^2$ for the P-well 1070, and P, 125 KeV, and $5.5\times 10^{11}/cm^2$ for the N-well 1080.

Figure 8:
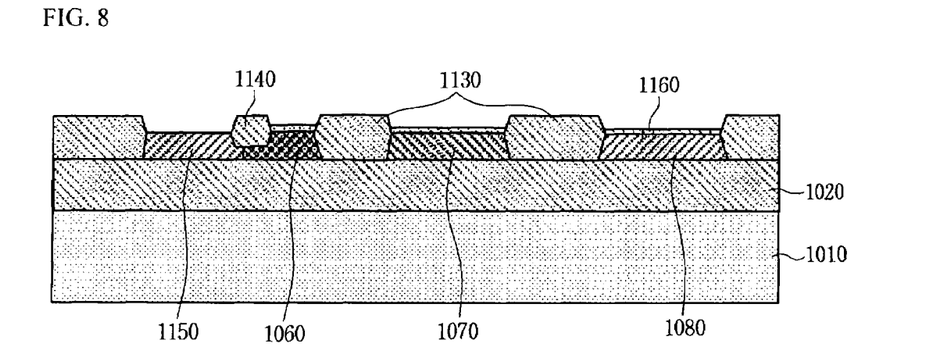

Referring to FIG. 8, a gate oxide film 1160 of the CMOS device is grown, and then the grown gate oxide film on the collector 1150 of the SiGe HBT is removed. The gate oxidation is performed in a thermal oxidation furnace of 850□ for about 1 hour by a thermal oxidation process. Preferably, the thickness of the gate oxide film is about 15 nm in case where a line width of the gate is about 0.5 μm, and is about 2 nm in the case of several tens of 5 nano.

Figure 9:
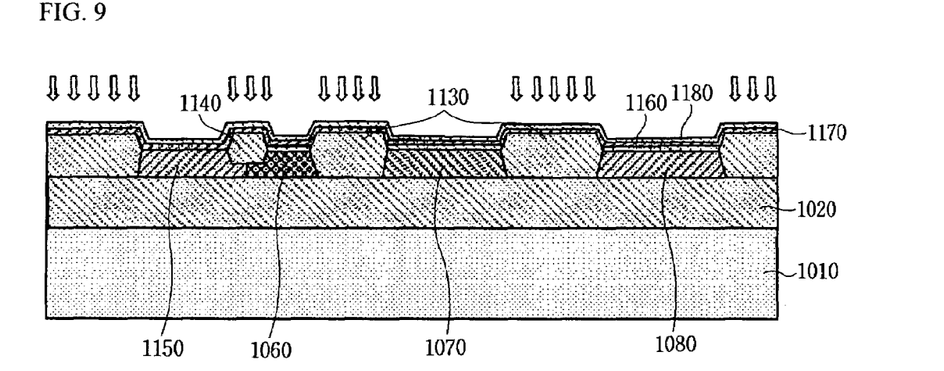

Referring to FIG. 9, a base epitaxial layer 1170 having a thickness of 120 nm to be served as a base of the SiGe HBT is grown, and then a protective oxide film 1180 is deposited thereon, and then high concentration ion implantation is performed into the base epitaxial layer 1170 which is disposed on the field oxide film 1130 and the oxide film 1140 between the collector 1150 and the collector plug 1060. The base epitaxial layer 1170 is grown by the steps of growing a buffer layer made of silicon with a thickness of 40 nm; growing a SiGe layer made by intermixing the silicon with 20% Ge with a thickness of 40 nm; and growing a cap layer made of the silicon with a thickness of 40 nm. The buffer layer and the cap layer are undoped silicon layers. A $P^+$ layer doped with boron (B) substantially serving as a base is disposed within the SiGe layer, and the thickness and the concentration thereof is about 15 nm and $5\times10^{19}/cm^3$, respectively. Accordingly, it is possible for high speed operations while maintaining a withstanding voltage of the collector since the $P^+$ layer is doped with high concentration. The base epitaxial layer 1170 is grown at a pressure of several tens of torr and a temperature in the range of 650 to 700 □ by a reduced pressure chemical vapor deposition method using gases including $SiH_4$, $GeH_4$, $B_2G_6$, and $H_2$. The protective oxide film 1180 is grown by using a low temperature oxide deposition (LTO) method at a temperature of 400 □, and the thickness thereof is about 400 nm. In addition, high concentration ion implantation is performed into the base epitaxial layer 1170 which is disposed on the field oxide film 1130 and the oxide film 1140 disposed on the junction between the collector 1150 and the collector plug 1060, to reduce the resistance of a base external connection layer and ensure a stable resistance value for a base resistor that is a resistor having a high resistance value to be served as a passive device when it is manufactured.

Figure 10:
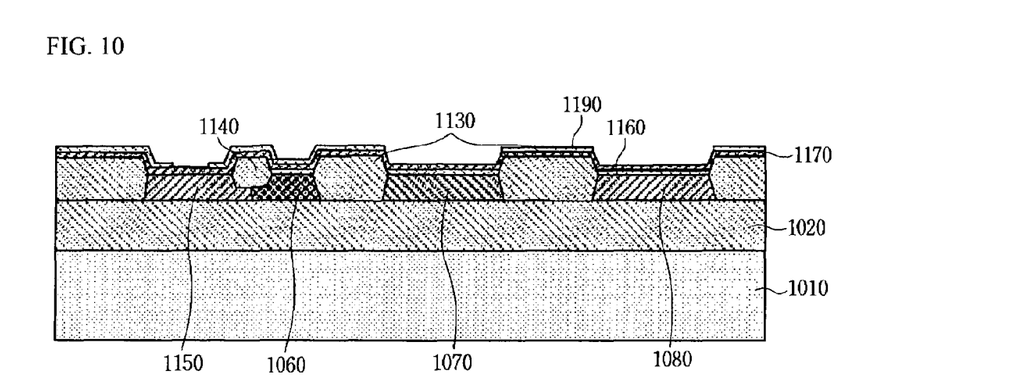

Referring to FIG. 10, oxide films are further formed to form the base epitaxial layer 1170 of the SiGe HTB and an interlayer insulating film 1190 between the emitters. In the oxide films, an oxide film disposed at the CMOS device region is removed because it is unnecessary, and a portion for the contact hole between the base epitaxial layer 1170 and the emitter is removed. The interlayer insulating film 1190 is formed by using the low temperature oxide deposition (LTO) method at a temperature of 400 □, and the thickness thereof is about 80 nm.

Figure 11:
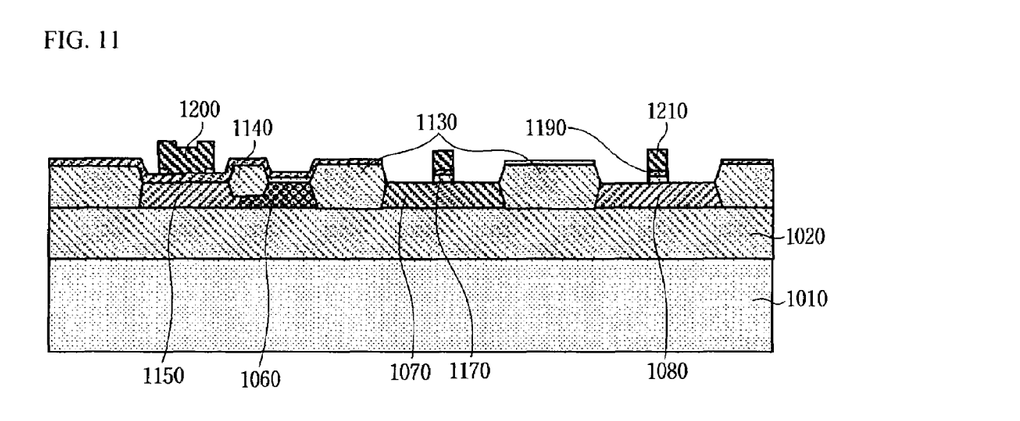

Referring to FIG. 11, a polysilicon layer is deposited, an emitter 1200 of the HBT and a gate 1210 of the CMOS device are formed by patterning the polysilicon layer, and then the oxide film is etched to form the oxide film 1190 disposed beneath the gate 1210 of the CMOS device. The polysilicon layer is formed by using a low pressure chemical vapor deposition (LPCVD) method at a temperature of 625 □, and the thickness thereof is about 350 nm.

Figure 12:
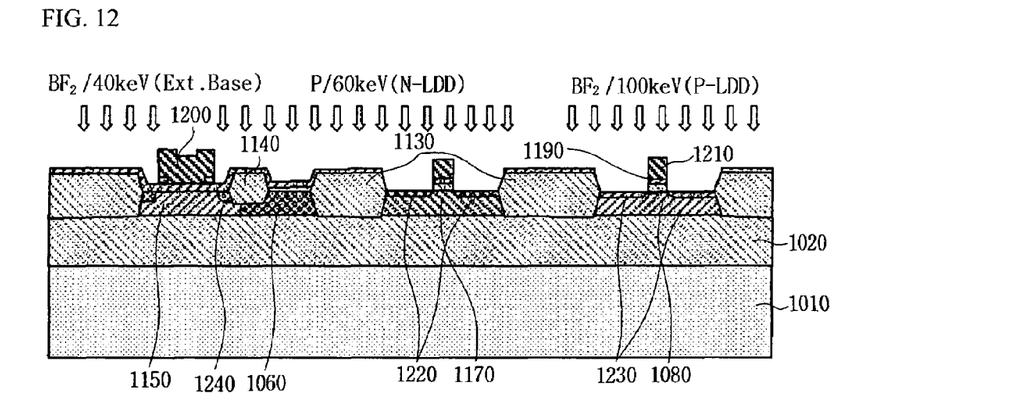

Referring to FIG. 12, a lightly doped drain (LLD) that is a shallow source/drain expansion region is formed by performing the ion implantation process into a source/drain region 1220 of the NMOS device and a source/drain region 1230 of the PMOS device, and then a base protective layer 1240 is formed by performing the ion implantation process into the edge of the active region of the SiGe HBT. The lightly doped drain serves to improve the operation withstanding voltage of the CMOS device, and to suppress the occurrence of hot carriers. The base protective layer 1240 serves to increase the current gain by prohibiting the recombination-extinction of an electron that is injected from the emitter into the base. The conditions of the ion implantation are P, 60 KeV, and $2.2\times10^{13}/cm^2$ for the N-LLD, $BF_2$, 100 KeV, and $9.0\times10^{12}/cm^2$ for the P-LDD, and $BF_2$, 40 KeV, and $4.0\times10^{14}/cm^2$ for the base protective layer 1240.

Figure 13:
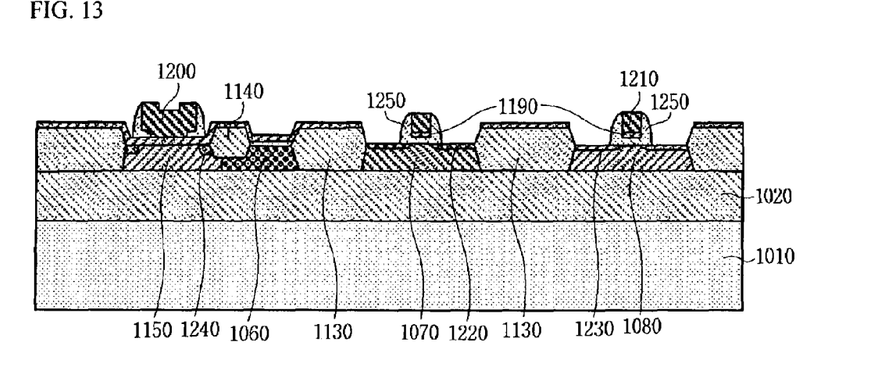

Referring to FIG. 13, there is shown a process for forming a spacer 1250 with a thickness of 200 nm at an emitter sidewall of the HBT and gate sidewalls of the NMOS device and PMOS device. The spacer 1250 serves to improve isolations between the emitter 1200 of the HBT and the base epitaxial layer 1170 and between the gate 1210 of the CMOS device and the source/drain regions 1220 and 1230, and to increase the breakdown voltage. The spacer 1250 is easily implemented by using a low temperature oxide deposition (LTO) method and a reactive ion etching (RIE) method.

Figure 14:
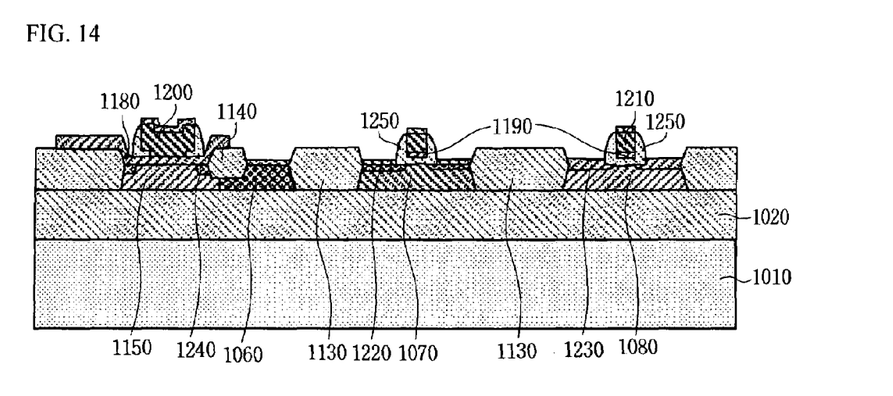

Referring to FIG. 14, a base 1170 is formed by patterning the base epitaxial layer 1170 of the HBT, the oxide film on the collector plug 1060 is removed, and then a selective epitaxial growth (SEG) is performed on an exposed portion of the base 1170 and the source/drain regions 1220 and 1230. The patterning of the base epitaxial layer 1170 can be optionally formed immediately after forming of the base epitaxial layer 1170 shown in FIG. 10. The selective epitaxial growth means that the epitaxial layer is grown on an exposed portion of the polysilicon or silicon layer, i.e. the emitter 1200 and the base layer 1180, the gate 1210 and the source/drain layers 1220 and 1230, but the epitaxial layer is not grown on a portion covered with the oxide film. Furthermore, a silicon epitaxial layer is grown in case that an epitaxial layer is grown on a silicon layer, and the polysilicon epitaxial layer is grown in case where an epitaxial layer is grown on a polysilicon layer. With the selective epitaxial growth, a subsequent metal silicide forming process can be performed in a stable fashion since the thickness of the exposed portion of the base 1170 becomes thick, and thus, to reduce the electric resistance of the portion. In addition, it is possible to protect a shallow injunction of the source/drain 1220 and 1230 of the CMOS device. The selective epitaxial growth is performed by using $SiH_2Cl_2$, HCl, and $H_2$ gases at a pressure of several tens of torr and a temperature of approximately 700 □, and the grown thickness is about 50 nm.

Figure 15:
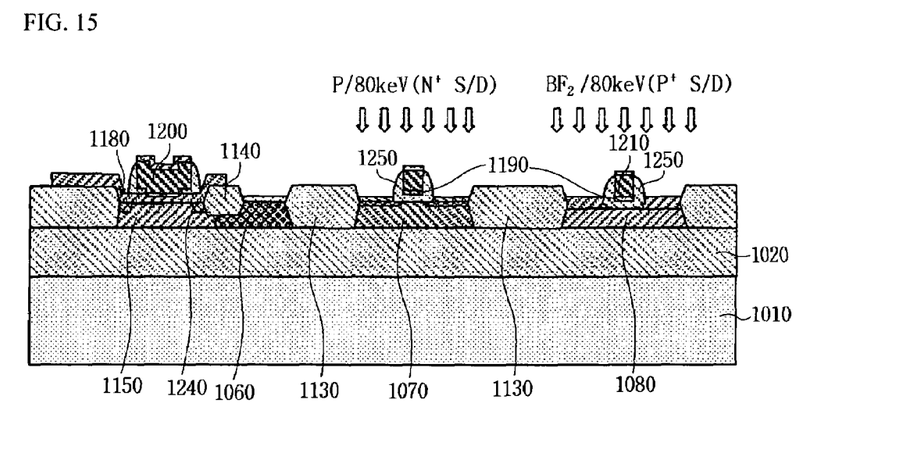

Referring to FIG. 15, high concentration ion implantation is performed into the source/drain 1220 and 1230 of the CMOS device. The conditions of the ion implantation are P, 80 KeV, and $8.0 \times 10^{15}/cm^2$ for the source/drain region 1220 of the NMOS device, and $BF_2$, 80 KeV, and $3.7 \times 10^{15}/cm^2$ for the source/drain region 1230 of the PMOS device.

Figure 16:
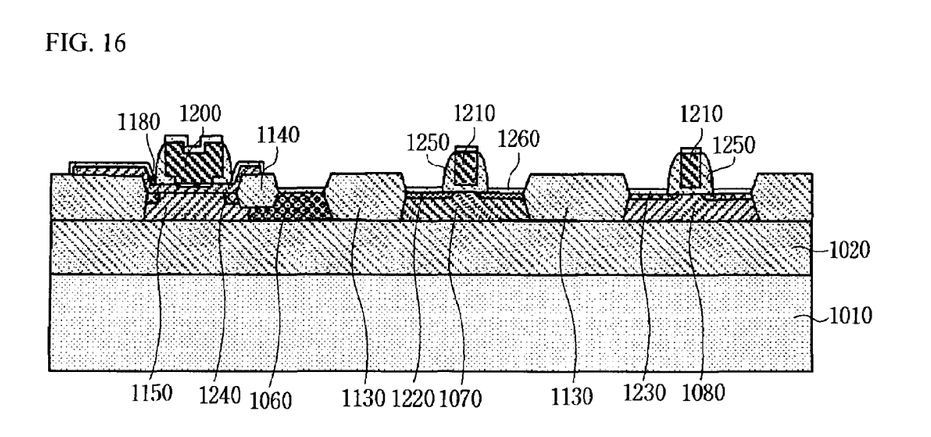

Referring to FIG. 16, a silicide layer 1260, which is a compound of silicon and metal, is formed. The silicide layer 1260 is formed by depositing Ti and TiN, which are metals for silicide, with a thickness of about 23 nm, respectively, using a sputtering apparatus; siliciding ($TiSi_2$) by means of a first heat treatment at a temperature of 650 □; etching the portions where the silicide is not formed with a chemical etchant; and performing a second heat treatment at a temperature of 850 □. The resulting electric resistivity of the silicide layer 1260 is in the range of about 5 to 20 ohm centimeter ($\Omega \cdot cm$). The silicide layer 1260 is formed at a point where the selective epitaxial growth occurs, i.e. the exposed region of the silicon or polysilicon layer. On the other hand, the silicide layer is not formed in the regions covered with the oxide film. Since the silicide has properties as mentioned above, it is referred to as a salicide (self aligned silicidation).

Figure 17:
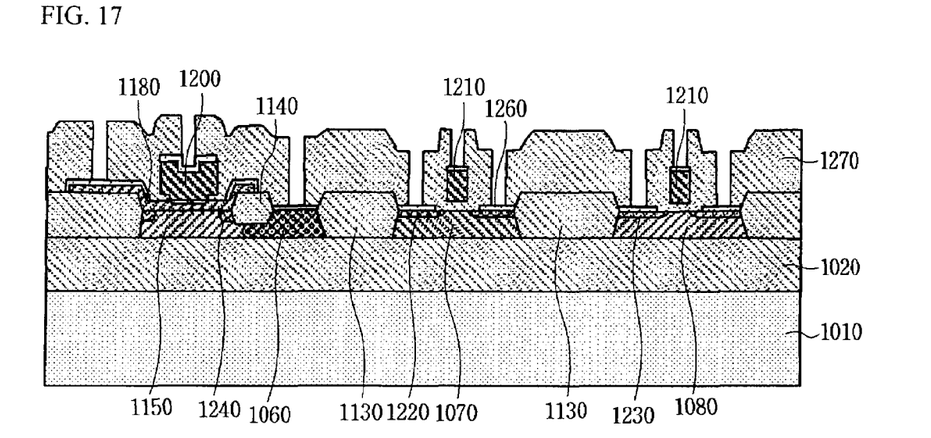

Referring to FIG. 17, an interlayer insulating film 1270 is deposited for external metal wirings and a contact hole is formed using an etching process. The interlayer insulating film is formed by using the low temperature oxide deposition (LTO) method at a temperature of 400 □, and the thickness thereof may be about 600 nm.

Figure 18:
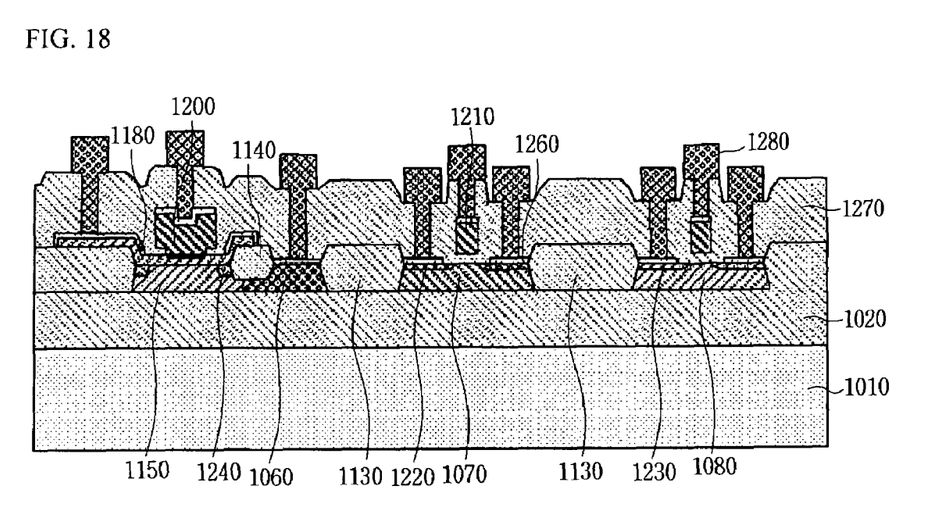

Referring to FIG. 18, a metal layer of Ti/TiN/Al is deposited by means of a sputter and patterned to form a metal wiring layer 1280, and then an alloying process is performed at a temperature of 450 □ in $N_2/H_2$ environment for 30 minutes. With this process, the resultant SiGe BiCMOS device is formed.

As described above, the configuration has advantages that an HBT having excellent RF and analog performances can be mounted on a substrate such as an SOI CMOS device, which has been widely employed for low power consumption, a size reduction and a high density of the device are possible by leveling the HBT device configuration along with the CMOS device, and the number of masks can be reduced to two sheet (for device isolation and sub-collector), as compared with the prior art.

A SiGe BiCMOS device according to the present invention has an advantage that power consumption is lowered.

In addition, the SiGe BiCMOS device according to the present invention has an advantage that it requires low costs for processes by reducing the number of masks being needed.

Further, the SiGe BiCMOS device according to the present invention has an advantage that the HBT can be fabricated together with the SOI CMOS device, thereby reducing the power consumption.

Still further, the SiGe BiCMOS device according to the present invention has an advantage that it is possible to increase the device density by reducing the horizontal dimension and vertical height of the HBT.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A method for manufacturing a BiCMOS device, comprising the steps of:

forming a collector plug, a P-well doped with P-type impurities, and an N-well doped with N-type impurities, in an SOI substrate having a first insulating film and a first semiconductor that is made of any one of N-type and P-type semiconductors and disposed on the first insulating film, the collector plug being made of the same type as the first semiconductor and more highly doped than the first semiconductor on a portion of the first semiconductor;

forming a buffer oxide film and a nitride film;

forming any one of a single open slit and a plurality of open slits by patterning the nitride film, and removing the nitride film disposed on a portion where a field oxide film is to be formed;

forming a field oxide film, a collector made of the first semiconductor surrounded with the field oxide film and the collector plug, and an oxide film disposed on a portion where the collector and the collector plug are contacted to each other and having a thickness thinner than that of the field oxide film, by performing a thermal oxidation process;

removing the nitride film;

forming a gate oxide film of a CMOS;

depositing a SiGe gate layer on the gate oxide film of the CMOS and a base epitaxial layer of a HBT simultaneously, wherein the SiGe gate layer made of same type of the first semiconductor;

depositing a second insulating film on the SiGe layer and removing a portion of the deposited second insulating film by patterning, wherein the portion of the second insulating film is deposited on a contact hole of the HBT and a gate of CMOS;

depositing a polysilicon layer on the gate of the CMOS and the contact hole of the HBT simultaneously, wherein the polysilicon layer made of the same type as the first semiconductor;

forming a gate of CMOS and an emitter of the HBT by patterning the polysilicon layer;

performing N-type doping with a low concentration into a source / drain region of the P-well, and P-type doping with a low concentration into a source/drain region of the N-well;

forming a spacer in a sidewall of the emitter and a sidewall of the gate of the CMOS device; and performing N-type doping with a high concentration into a source/drain region of the NMOS device, and P-type doping with a high concentration into a source/drain region of the PMOS device;

forming a base protective layer on an edge of a portion where the base and the collector are contacted to each other, the base protective layer being made of the same type of semiconductor as the base, and more highly doped than the base, after forming the emitter and the gate of the CMOS device;

patterning the base of HBT;

forming a silicide layer of a compound of a silicon and a metal;

forming a third insulating film; and forming an emitter wiring; a base wiring; a collector plug wiring of the HBT device; a source wiring, a drain wiring and a gate wiring of the CMOS device; by depositing and patterning a conductor metal.

* * * * *